United States Patent
Gruenwald et al.

[11] Patent Number: 5,891,365
[45] Date of Patent: Apr. 6, 1999

[54] ANISOTROPICALLY CONDUCTING ADHESIVE

[75] Inventors: Werner Gruenwald, Gerlingen; Ralf Haug, Leonberg; Frank-Dieter Hauschild, Hildesheim; Martin Seyffert, Hildesheim; Holger Guenster, Hildesheim, all of Germany

[73] Assignee: Robert Bosch GmbH, Stuttgart, Germany

[21] Appl. No.: 676,292
[22] PCT Filed: Feb. 7, 1995
[86] PCT No.: PCT/DE95/00151
§ 371 Date: Jul. 18, 1996
§ 102(e) Date: Jul. 18, 1996
[87] PCT Pub. No.: WO95/23416
PCT Pub. Date: Aug. 31, 1995

[30] Foreign Application Priority Data

Feb. 28, 1994 [DE] Germany .......................... 44 06 418.7

[51] Int. Cl.$^6$ .............................. H01B 1/20; H01B 1/22; C09J 5/00; C09J 9/02
[52] U.S. Cl. .......................... 252/512; 252/500; 252/514; 156/47; 156/306.3
[58] Field of Search ................................... 252/500, 512, 252/513, 514; 427/331; 428/407; 439/66; 156/47, 306.3

[56] References Cited

U.S. PATENT DOCUMENTS

| | | | |
|---|---|---|---|
| 4,735,847 | 4/1988 | Fujiwana et al. | 428/209 |
| 4,999,460 | 3/1991 | Sugiyama et al. | 174/94 R |
| 5,136,365 | 8/1992 | Pennisi et al. | 357/72 |
| 5,376,403 | 12/1994 | Capote et al. | 427/96 |

*Primary Examiner*—Mark Kopec
*Attorney, Agent, or Firm*—Venable; Norman N. Kunitz; Ashley J. Wells

[57] ABSTRACT

An anisotropically conducting adhesive includes an adhesive base material; and conductive particles which are dispersed in the adhesive base material and which have provided on the surface of the conductive particles a separating agent comprised of at least one ligand which is selected from the group consisting of triphenylphosphine and propionic acid, which decomposes during use of the anisotropically conducting adhesive in an adhesion process and which is non-polymeric. A method for producing a bonded, electrically conductive connection between a plurality of strip connectors includes (a) providing the foregoing anisotropically conducting adhesive; (b) positioning strip connectors on opposite surfaces of the anisotropically conducting adhesive; (c) applying pressure to the anisotropically conducting adhesive and the strip connectors; and (d) decomposing the at least one ligand of the anisotropically conducting adhesive.

9 Claims, 1 Drawing Sheet

ANISOTROPICALLY CONDUCTING ADHESIVE

BACKGROUND OF THE INVENTION

1. Field of the Invention

The invention concerns an anisotropically conducting adhesive in accordance with the preamble to claim 1.

2. Description of the related Art

Anisotropically conducting adhesives are known. These show finely dispersed conductive particles in a base material, for example in a thermoplastic material. The conductive particles there are dispersed as a granular powder in the base material. The anisotropically conductive adhesives, for example, exist in the shape of a foil and are suitable for bonding together two contacts to be electrically conductive, for example two strip conductors. Under the effects of pressure and temperature, the strip conductors are pressed onto opposite sides of the conductive adhesive so that the base material deforms and the electrically conductive particles dispersed in this material create an electrically conductive connection between the applied strip conductors. The base material here functions as an adhesive for the strip conductors.

It becomes clear that the resolution of the anisotropically conductive adhesive, that is the minimal possible space between two neighboring electrically conductive connections, depends on the composition of the dispersed electrically conductive particles. So that these particles permit an electrically conductive connection in one direction only, they must be at a sufficient distance from each other so that an undesired electrically conductive connection between the particles themselves is avoided. However, one disadvantage is that coagulation occurs during the dispersion of the conductive particles in the base material, meaning the lumping together of a majority of these electrically conductive particles. Because of that, the known anisotropically conductive adhesives can be used only to connect strip conductors or similar devices that are arranged relatively far from each other because otherwise a sufficient contact safety is not ensured.

SUMMARY OF THE INVENTION

The anisotropically conductive adhesive according to the invention, on the other hand, has the advantage that an even dispersion of the conductive particles in the base material is possible. The invention provides an anisotropically conducting adhesive with conductive particles that are dispersed in a base material, characterized in that these particles (14) exhibit as separating agents ligands on their surface which decompose during an adhesion process. The invention additionally provides a method for producing a bonded, electrically conductive connection between strip connectors, characterized in that the strip connectors are put on opposite surfaces of a adhesive, in accordance with one of the Patent claims 1 to 7, that pressure is applied to the adhesive and the strip connectors and that the ligands in the adhesive are decomposed. A coagulation of these particles is avoided due to the fact that the surfaces of these conductive particles are provided with separating agents. Thus, these particles are dispersed evenly in the base material without being electrically connected with each other. This has the advantage that the minimum space between two neighboring contact connections is actually determined only by a granule size of the electrically conductive particles. The anisotropism of this contact connection is ensured here with a high degree of certainty.

The preferred embodiment of the invention provides for the separating agents to consist of a coating of ligands which, preferably, are thermally unstable. This provides that in an unprocessed conductive adhesive, the electrically conductive particles are kept at a distance by the ligands. Because the ligands are thermally unstable, they are decomposed during the adherence and contacting process and thus cannot impede the forming of an electrically conductive connection. The destruction of the ligands occurs only at a point in time during the adherence and contacting process when the electrically conductive particles are already under a certain pressure so that these can no longer come in contact with each other despite the fact that the separating agents are no longer effective.

Further expedient embodiments of this invention result from the other characteristics listed in the dependent claims as follows.

The ligands are advantageously thermally unstable. The ligands have a decomposition temperature that is below a conglutination temperature. Triphenylphosphine or propionic acid may be used as the ligand. The particles may be composed of gold, nickel, gold-plated nickel, silver or STYROFOAM (i.e., foamed polystyrene) balls coated with gold. The base material may be a duroplastic or a thermoplastic. In the method according to the invention, the ligands may be decomposed during warming up.

BRIEF DESCRIPTION OF THE DRAWINGS

The invention is explained in more detail in the following with the aid of an exemplary embodiment and the attached drawings. Shown are.

DESCRIPTION OF THE PREFERRED EMBODIMENTS

Figure 1:
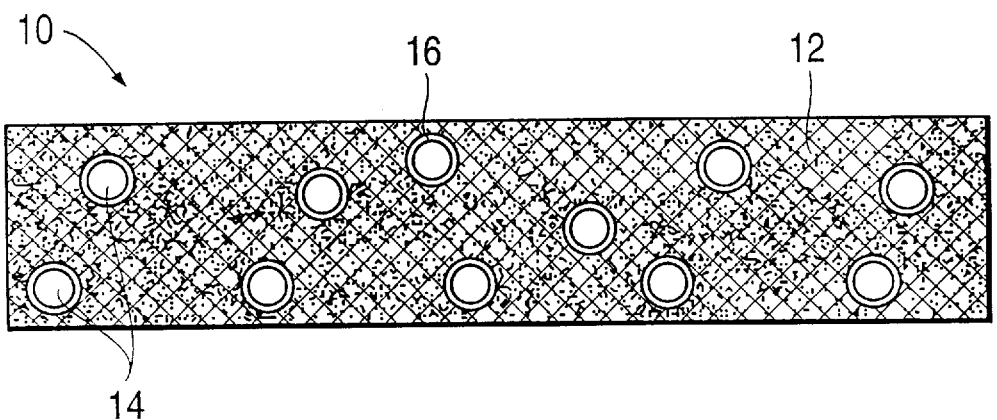
FIG. 1, sectional view through an anisotropically conductive adhesive in the initial state and FIG. 2, sectional view through an anisotropically conductive adhesive in the contacting state.

FIG. 1 shows an anisotropically conductive adhesive 10 present in foil form. Adhesive 10 is composed of a base material 12 and therein dispersed finely divided, conductive particles 14. The base material 12 here consists, for example, of a duroplastic (i.e., a thermosetting polymer) or a thermoplastic. Particles 14, for example, may be composed of gold, nickel, gilded nickel, silver or foamed polystyrene balls coated with a layer of gold. Particles 14 are coated with a layer 16 that is not shown to scale in FIG. 1. This layer 16 here consists, for example, of triphenylphosphine.

Figure 2:
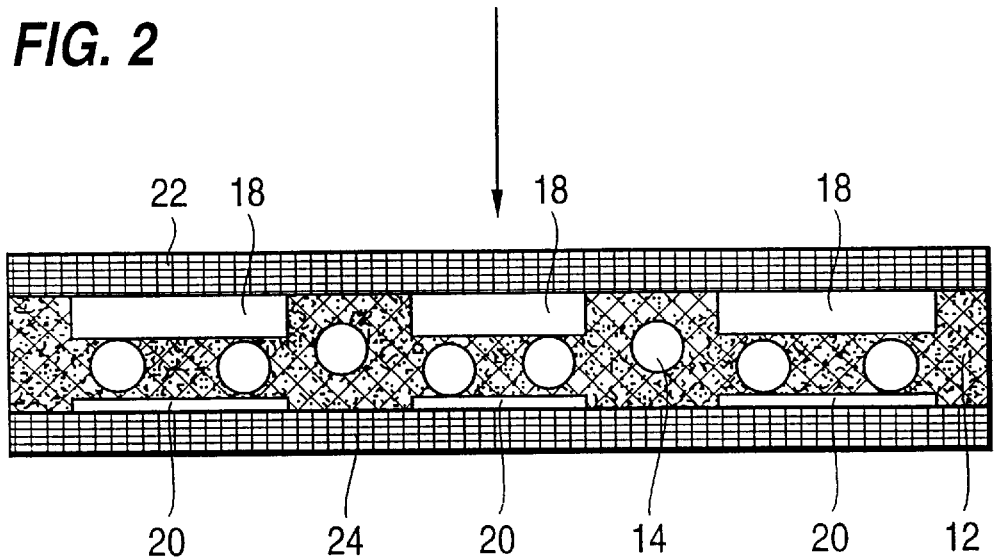

FIG. 2 shows one option for an adhesive contact with the adhesive shown in FIG. 1. Strip conductors 18 and 20 are placed onto opposite surfaces of adhesive 10. Strip conductors 18 and 20 respectively here are still sitting on top of adhesive 10 and have not penetrated it. A polyester or polyamide foil 22, for example, is placed over strip conductors 18. Strip conductors 20 are also covered with a foil 24. Foils 22 and 24 can at the same time a component of an electronic element that contains strip conductors 18 and 20.

A contact with adhesive 10 shown in FIGS. 1 and 2 is made as follows. A punch, indicated in FIG. 2 by the arrow, is used to exert pressure on the arrangement consisting of adhesive 10 with the applied strip conductors 18 and 20 as well as foils 22 and 24. A warming up of the arrangement takes place at the same time. As a result of the warming up, thermoplastic base material 12 is softened so that strip conductors 18 and 20 can enter the base material 12 under pressure of the punch. During the warming up, the triphenylphosphine layer 16 decomposes because it has a decomposition temperature of approx. 60° C. while the base material 12 is heated to a temperature of approx. 150° to 230° C. which is the conglutination temperature. As a result of the decomposition of coating 16, strip conductors 18 and 20 can be pushed far enough toward particles 14 so that an electrically conductive connection is formed between particles 14 and strip conductors 18 and 20. After the arrangement has hardened, for example over a period of 5 to 30 seconds, the punch can be removed and the strip conductors 18 and 20 make continuous electrical contact. Due to the fact that the electrical connection is taken over completely by particles 14 between strip conductors 18 and 20, side by side contacts between strip conductors 18 and 20 can be realized in the smallest of space without resulting in wrong connections through contact between particles 14. On the whole, this makes a higher resolution between adjacent strip conductors 18 and 20 possible. The complete contact connection is made very secure by this. Flexible connections can be formed very advantageously between strip connectors 18 and 20 with the anisotropically conductive adhesive 10 shown in FIGS. 1 and 2. The flexibility of the material here depends solely on base material 12.

The invention is not limited to the exemplary embodiment shown in FIGS. 1 and 2. For example, adhesive 10 can also take the form of a paste, film or heat-sealing foil. The connection of two strip conductors 18 and 20 must simply be understood to be the simplest form of exemplary embodiment. With respectively structured punches, for example, it is possible to form various through connections distributed over the surface of an adhesive 10, which can vary depending on their use.

What is claimed is:

1. An anisotropically conducting adhesive, comprising:

an adhesive base material; and conductive particles which are evenly dispersed in the adhesive base material and which have provided on the surface of the conductive particles a separating agent comprised of at least one ligand which is selected from the group consisting of triphenylphosphine and propionic acid, which prevents coagulation of the conductive particles, which decomposes during use of the anisotropically conducting adhesive in an adhesion process, and which is non-polymeric.

2. The anisotropically conducting adhesive according to claim 1, wherein the at least one ligand is thermally unstable.

3. The anisotropically conducting adhesive according to claim 1, wherein the anisotropically conducting adhesive has a conglutination temperature, and wherein the at least one ligand has a decomposition temperature that is below the conglutination temperature.

4. The anisotropically conducting adhesive according to claim 1, wherein the conductive particles are composed of a material selected from the group consisting of gold, nickel, gold-plated nickel, silver and foamed polystyrene balls coated with gold.

5. The anisotropically conducting adhesive according to claim 1, wherein the adhesive base material is a plastic material selected from the group consisting of a thermosetting polymer and a thermoplastic polymer.

6. A method for producing a bonded, electrically conductive connection between a plurality of strip connectors, comprising:

a. providing an anisotropically conducting adhesive comprised of an adhesive base material and conductive particles which are evenly dispersed in the adhesive base material and which have provided on the surface of the conductive particles a separating agent comprised of at least one ligand which is selected from the group consisting of triphenylphosphine and propionic acid, which prevents coagulation of the conductive particles, which decomposes during use of the anisotropically conducting adhesive in an adhesion process, and which is non-polymeric;

b. positioning strip connectors on opposite surfaces of the anisotropically conducting adhesive;

c. applying pressure to the anisotropically conducting adhesive and the strip connectors; and d. decomposing the at least one ligand of the anisotropically conducting adhesive.

7. The method according to claim 6, wherein the at least one ligand is decomposed in step (d) by heating the anisotropically conducting adhesive to a temperature effective to decompose the at least one ligand.

8. An anisotropically conducting adhesive, comprising:

an adhesive base material; and conductive particles dispersed in the base material and having provided on the surfaces thereof a separating agent which is a ligand and which decomposes during an adhesion process, wherein the ligand is triphenylphosphine.

9. An anisotropically conducting adhesive, comprising:

an adhesive base material; and conductive particles dispersed in the base material and having provided on the surfaces thereof a separating agent which is a ligand and which decomposes during an adhesion process, wherein the ligand is propionic acid.

* * * * *